United States Patent
Sauer

(10) Patent No.: US 6,366,473 B1
(45) Date of Patent: Apr. 2, 2002

(54) METHOD FOR SUPPORTING A WALL

(75) Inventor: Scott B. Sauer, Rocklin, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 09/435,953

(22) Filed: Nov. 9, 1999

(51) Int. Cl.$^7$ .............................................. H05K 9/00
(52) U.S. Cl. .................. 361/818; 361/803; 361/784; 361/749; 439/65
(58) Field of Search .......................... 361/818, 670, 361/629, 671, 640, 363, 749, 437, 732, 803, 784; 439/65; 174/35 R

(56) References Cited

U.S. PATENT DOCUMENTS

| | | | | |
|---|---|---|---|---|
| 3,968,336 A | * | 7/1976 | Johnson | 200/5 |
| 4,724,760 A | * | 2/1988 | Bubley | 101/115 |
| 5,176,238 A | * | 1/1993 | Deglau | 194/338 |
| 5,437,408 A | * | 8/1995 | Chesnut | 232/4 R |
| 5,754,411 A | * | 5/1998 | Woychik | 361/803 |
| 5,835,356 A | * | 11/1998 | Wieloch et al. | 361/761 |
| 6,195,618 B1 | * | 2/2001 | Rosenberg et al. | 702/152 |
| 6,197,254 B1 | * | 3/2001 | Silver et al. | 422/52 |

FOREIGN PATENT DOCUMENTS

JP  53-117991  * 10/1978 .................. 372/43

* cited by examiner

Primary Examiner—Jeffrey Gaffin
Assistant Examiner—Hung Bui
(74) Attorney, Agent, or Firm—Myers, Dawes & Andras LLP

(57) ABSTRACT

An amplifier assembly having a grounded mode wall is disclosed. The mode wall is supported in a substantially serpentine slot in an amplifier substrate. The serpentine slot supports and grounds the mode wall at a plurality of points of contact. The points of contact are spaced apart at roughly ¼ the wavelength or less of EMI emissions of the amplifier circuitry.

1 Claim, 5 Drawing Sheets

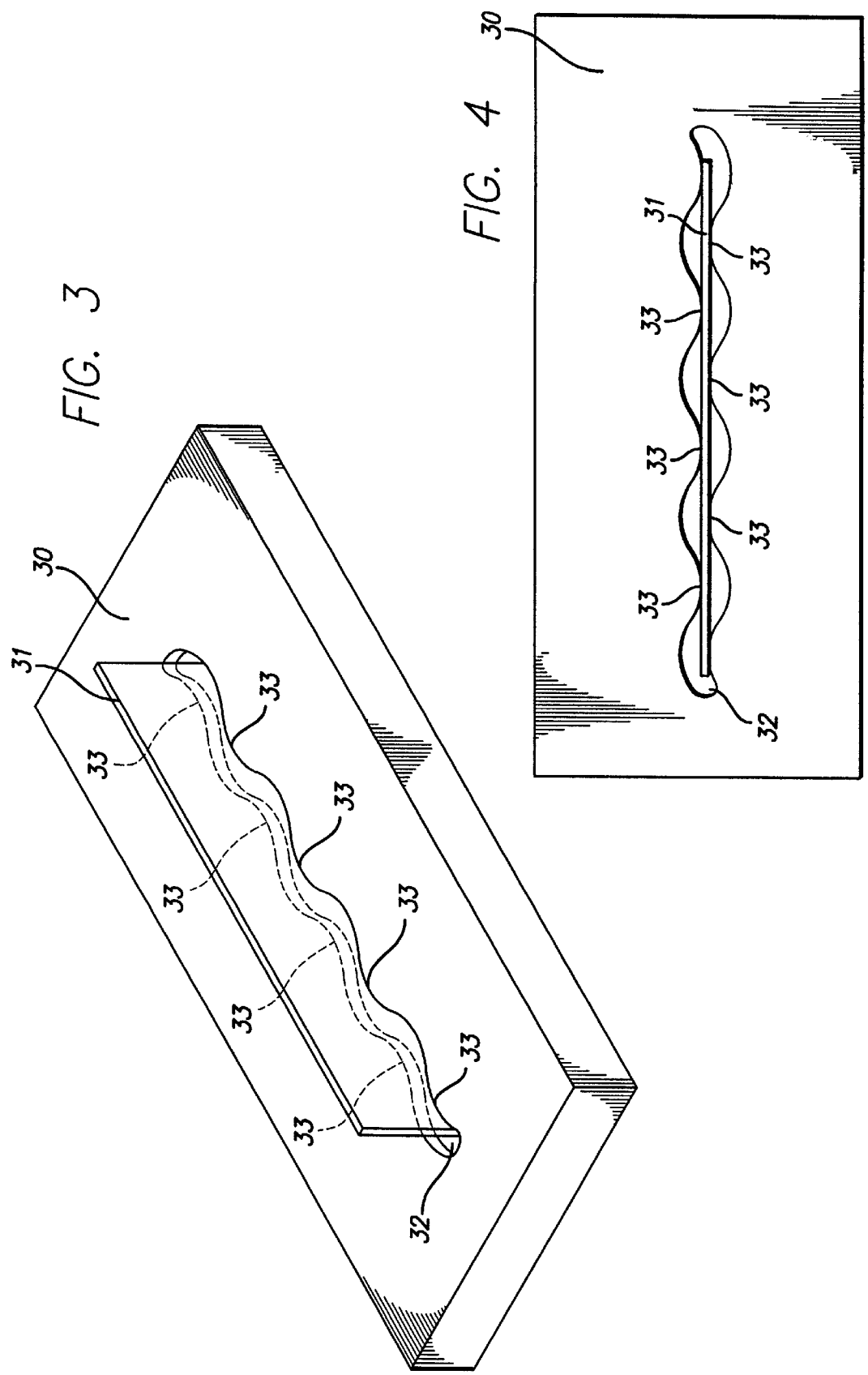

METHOD FOR SUPPORTING A WALL

BACKGROUND OF THE INVENTION

1. Field of Invention

The present invention relates to a method for supposing mode walls, or other wall-like structures, without the use of conventional attachment methods such as screws or clips.

2. Description of the Related Art

Mode walls are thin wall structures typically used within electronic equipment for a variety of purposes, including isolating electrical components from electromagnetic interference (EMI) emissions. Mode walls are necessarily widely used in a variety of electrical devices such as audio amplifiers, cellular phones, and others.

FIG. 1 shows a conventional method of supporting a mode wall structure within an environment of amplifier pallets. A mode wall 11 having an L-shaped feature 13 is positioned in a slot 16 between two amplifier pallets 10. The mode wall 11 is supported by using a screw 14, which secures the mode wall 11 onto a bed of substrate 12 by connecting the L-shaped feature 13 to the substrate 12. The substrate 12 has a cavity 15 that is wide enough to allow for insertion of the L-shaped feature 13. The L-shaped feature 13 and the cavity 15 must also be sufficiently wide to allow for insertion of an attaching mechanism such as a screw 14 and tools required to fix the attaching mechanism in place.

Many disadvantages are associated with the conventional method illustrated in FIG. 1. First, due to the compact arrangements of components typically found within electrical circuitry, it is often very difficult to insert a device such as a screw gun to secure the L-shaped feature 13 within the cavity 15. At the same time, it often becomes very difficult to insert a mode wall with an L-shaped feature into a slot that is, in the case of amplifier circuits, often no wider than 0.03 inches. Furthermore, because a cavity must be formed to support an L-shaped feature, at least part of one of the amplifier pallets 10 extends over empty space. Incidentally, surface contact with the underlying substrate material allows an amplifier pallet to disperse excess thermal energy, a process that is essential in achieving maximum power capability. Consequently, reduced surface contact with the substrate below, as in the case of a cavity formation, decreases an amplifier pallet's power capability.

FIG. 7 shows another example of a conventional method of supporting mode wall-like structures. Small metal clips 73 are installed at several locations on a circuit board 72 using either hand mounting techniques or surface mount technology. The mode wall 71 is then installed between the metal clips 73. The location and the number of metal clips 73 determines the grounding points for the mode wall 71 and therefore its relative effectiveness. Several disadvantages are associated with this conventional method of support. First, it can be costly to manufacture and install the metal clips 73. More particularly, it may become very difficult and time consuming to access through the neighboring components on the circuit board in order to align accurately each metal clip such that the metal clips 73 form an accurate linear path or a path matching the curvature of the mode-wall like structure to be installed. Second, it may become difficult to install the mode wall-like structure in between the clips, especially if the mode-wall like structure is not linear. Finally, a mode-wall installed using metal clips may not be appropriately grounded through limited contact using the clips.

FIG. 2 shows another example of a conventional method for supporting mode wall-like structures. A thin elongated slot 22 is cut on a substrate 20 using a diameter cutter. The diameter of the thin slot 22 is slightly larger than the width of the mode wall 21 such that mode wall 21 can fit snugly and rigidly into the thin slot 22. The mode wall 21 is grounded in several portions at which the mode wall 21 comes in contact with electrical contacts 23, which are tightly pressed between the outer side of mode wall 21 and an inner side of the thin slot 22.

The method illustrated in FIG. 2 also causes many disadvantages and difficulties. First, there is a limit on how thin a slot can be cut by a diameter cutter. Currently, the thinnest slot width able to be cut by a diameter cutter is about 1/32 of an inch in width (approximately 0.03 inches). This minimum width requires the use of heavier sheet metals in order to accommodate a snug fit. In addition, a small diameter cutter has a significant deflection problem, which makes it difficult to meet and satisfy tight tolerances at any reasonable metal removal rates. Moreover, due to the deflection problem, small diameter cutters are often manufactured with a short overall length to minimize the deflection. Since the body of a diameter cutter is generally much wider than the cutter itself, this limits the cutter's ability to access tight spaces on the substrate within an amplifier case (a problem otherwise known as milling head interference). Finally, if a slot with interference is required, the full length of the slot must be an interference or snug fit, making it difficult to install a thin mode wall into the slot. An interference fit of this type often requires that the application of load from both sides of the slot to "crush" the mode wall in order for the mode wall to be properly secured. As a result, elements such as electrical contacts 23 from FIG. 2 become extremely difficult to assemble.

SUMMARY OF THE INVENTION

The present invention provides an amplifier assembly having a grounded mode wall which overcomes the above noted disadvantages in supporting mode walls.

In particular the present invention provides an amplifier assembly, comprising a mode wall and a substrate having an upper support surface for supporting amplifier circuitry which generates EMI emissions having a wavelength. A substantially serpentine slot is provided in the upper support surface of the substrate which supports and grounds the mode well. More specifically, the serpentine slot defines a plurality of points of contact arranged to contact and ground the mode wall. The points of contact are spaced apart at roughly ¼ of the wavelength or less such that the mode wall is grounded at a spacing of roughly ¼ of the wavelength.

Further features and advantages of the present invention are set out in the following detailed description of the invention.

BRIEF DESCRIPTION OF THE DRAWINGS

FIG. 3 is an illustration of a preferred embodiment of the present invention.

FIG. 4 is a top-view illustration of a preferred embodiment of the present invention.

DETAILED DESCRIPTION OF PREFERRED EMBODIMENTS

Figure 1:
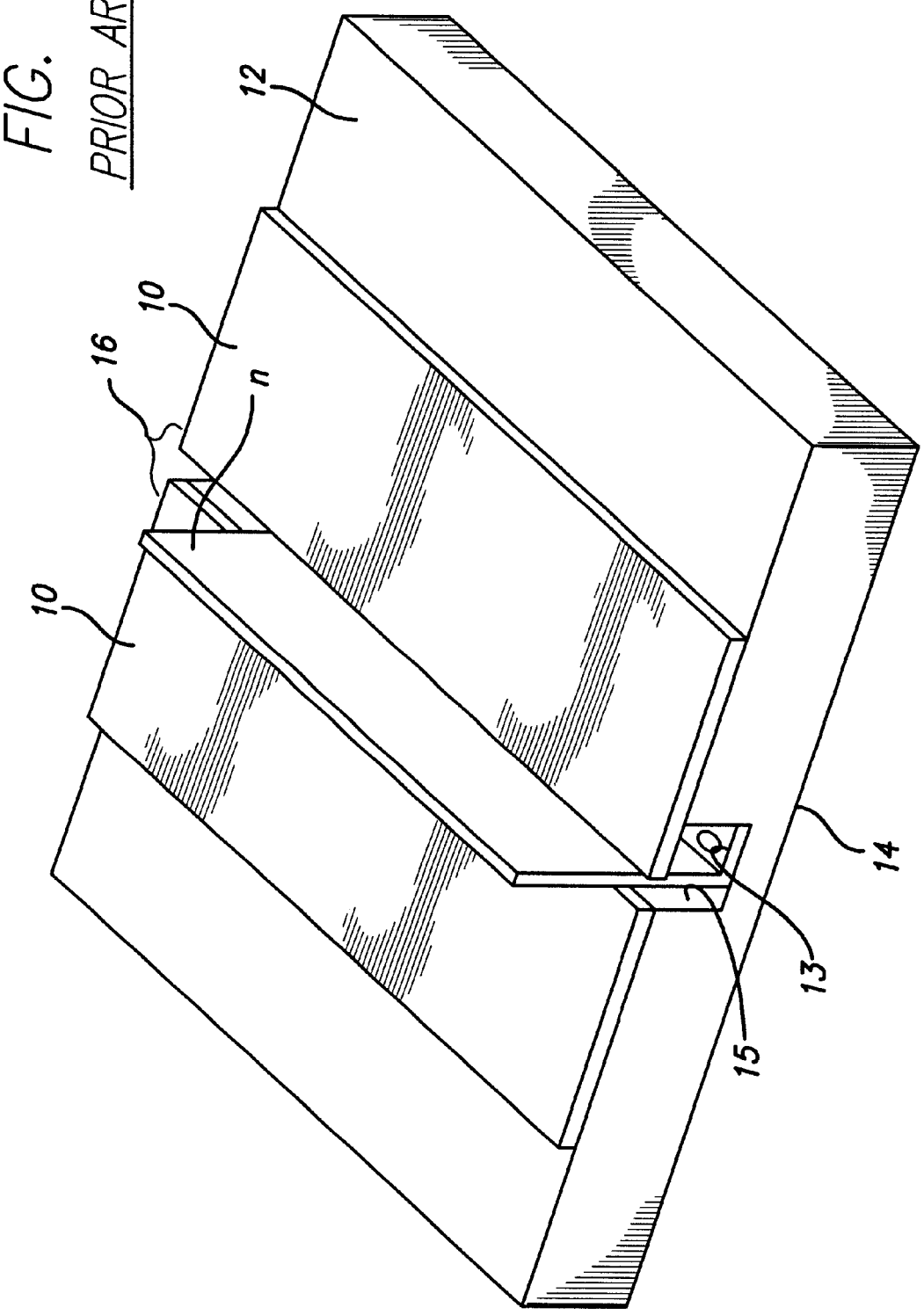
FIG. 1 is an illustration of a conventional method of supporting a mode wall having an L-shaped feature.
Figure 2:
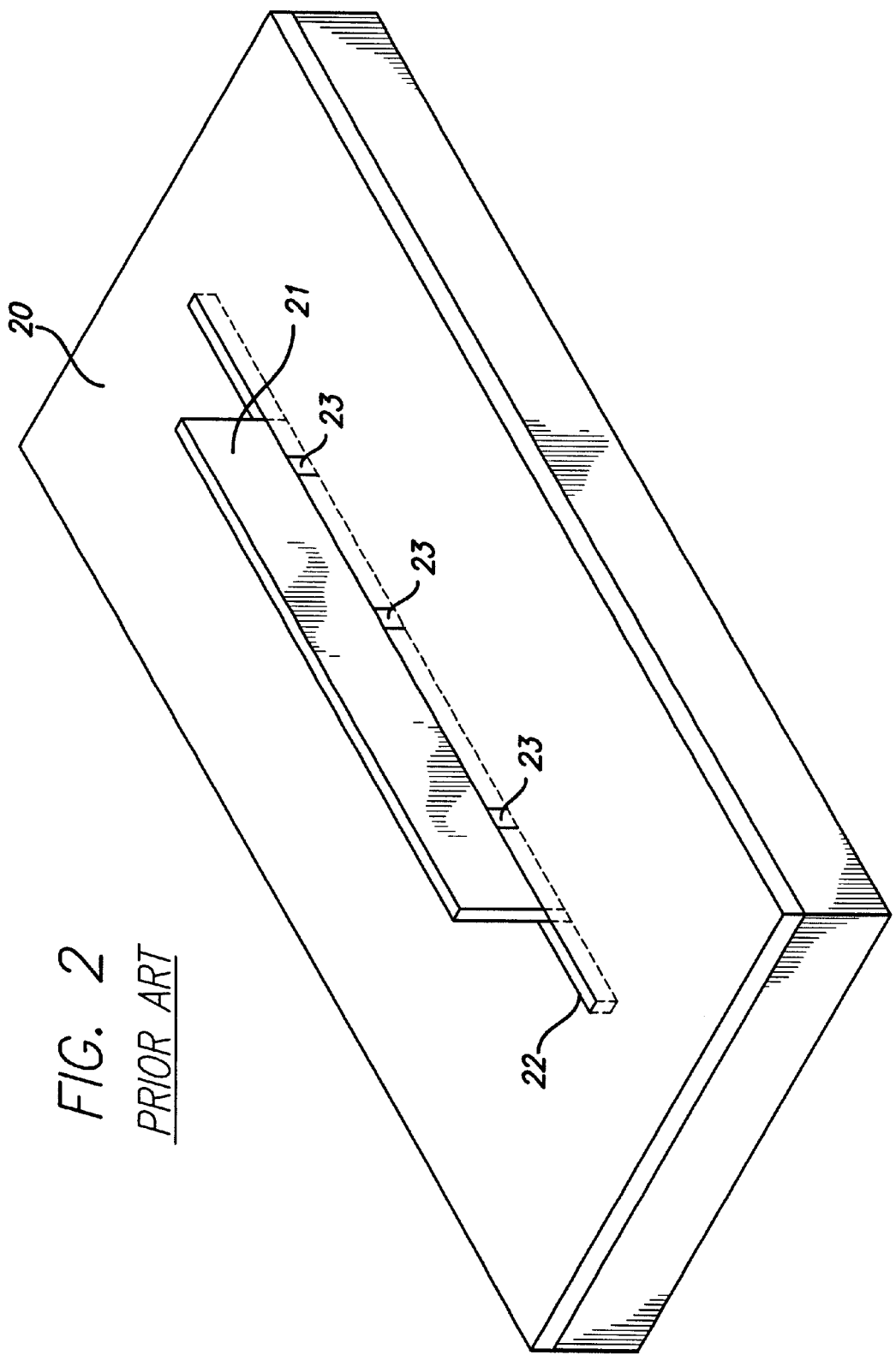
FIG. 2 is an illustration of another conventional method of supporting a mode wall using a thin slot.

Preferred embodiments of the present invention will now be described with references to FIGS. 3–6.

FIG. 3 is a perspective dimensional view of a mode wall being supported according to a preferred embodiment of the present invention. According to a preferred embodiment of the present invention, a method of supporting a wall, such as a mode wall, includes the steps of forming a substantially serpentine slot 32 in a substrate 30, and inserting a wall to be supported in the substantially serpentine slot.

It is preferred that a diameter cutter is used to cut the substantially serpentine slot 32 preferably in the substrate 30. However, other cutting devices, apparatuses or methods may be used to form the substantially serpentine slot 32, such as the die-cast method described below.

The substantially serpentine slot 32 is formed such that an area of central clearance is produced by the cutting action. The area of central clearance is best seen in FIG. 4 and is defined as an area bounded by a plurality of points of contact 33 defined by the substantially serpentine slot 32. The area of central clearance produced is sufficiently wide such that a sheet-like structure, such as a mode wall 31, can be easily inserted into the clearance while being supported by the inner sides of the serpentine slot at the points of contact 33. Although FIG. 3 illustrates mode wall 31 as having a greater height than the depth of the serpent slot, it is within the scope of the present invention to insert a, sheet-like structure having a height measurement that is less than the depth of the substantially serpentine slot.

While the central clearance area should be sufficiently wide to allow the insertion of the mode wall 31, the central clearance area may be wider, narrower, or of equal width to the width mode wall 31. In the case where the clearance area is wider than the width of mode wall 31, the fit is referred to as a loose fit. In the case where the clearance area is narrower than the width of mode wall, the fit is referred to as an interference fit (i.e., forcing a slightly larger object into a smaller opening). In the case where the clearance area is of equal width to the width of the mode wall, the fit is referred to as a line-to-line fit. All three types of fit are contemplated within the scope of the present invention.

FIG. 4 shows a top view of a preferred embodiment of the present invention. As FIG. 4 illustrates, although the width of the substantially serpentine slot 32 is preferably significantly wider relative to the width of the mode wall structure 31, the area of central clearance is much more narrow than the width of the slot 32, and is capable of supporting the mode wall structure 31 having a very narrow width.

Figure 5:
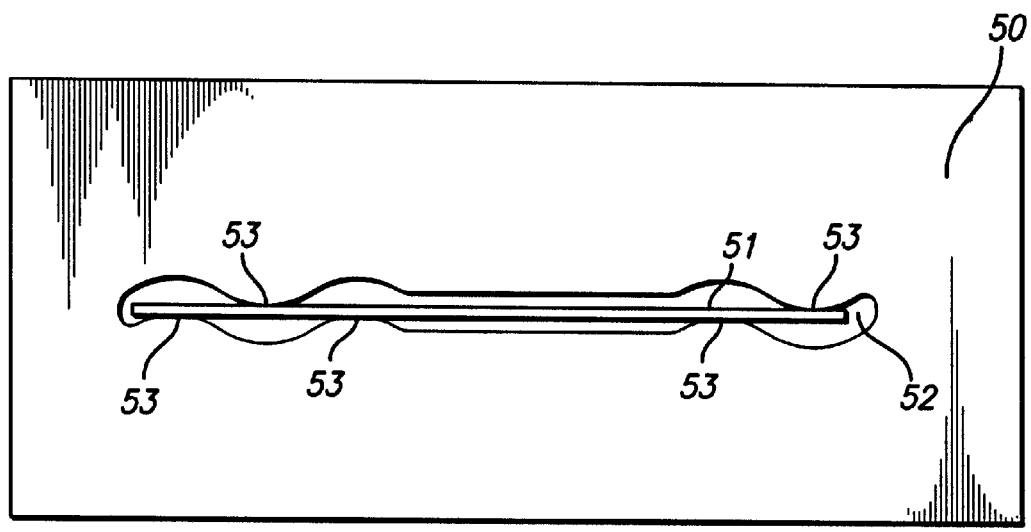
FIG. 5 is a top view illustration of an alternative preferred embodiment of the present invention.

FIG. 5 shows the top view of an alternative preferred embodiment of the present invention. A substantially serpentine slot 52 having an irregular curvature is formed such that a substantial portion of the slot is linear and does not include points of contact 53. This alternative method illustrates an example of selectively positioning the points of contacts 53 to be used to support the mode wall 51.

In an environment where a mode wall is to be used for isolating EMI emissions, the mode wall is preferably grounded at a spacing of about ¼ of the wavelength of the EMI field. However, not all EMI emissions have the same wavelength. The present invention's ability to easily and accurately position the points of grounding contact allows for one skilled in the art to design the substantially serpentine slot such that the mode wall is always grounded at spacings that are substantially equal to about ¼ of the normal EMI wavelengths, thus providing maximum EMI isolation.

It should be noted that in preferred embodiments of the present invention, the number and position of points of contact may be changed and adjusted according to a desired application or design. Thus, the process of forming the substantially serpentine slot can be easily modified to achieve various substantially serpentine slots having different numbers and locations of points of contact.

Figure 6:
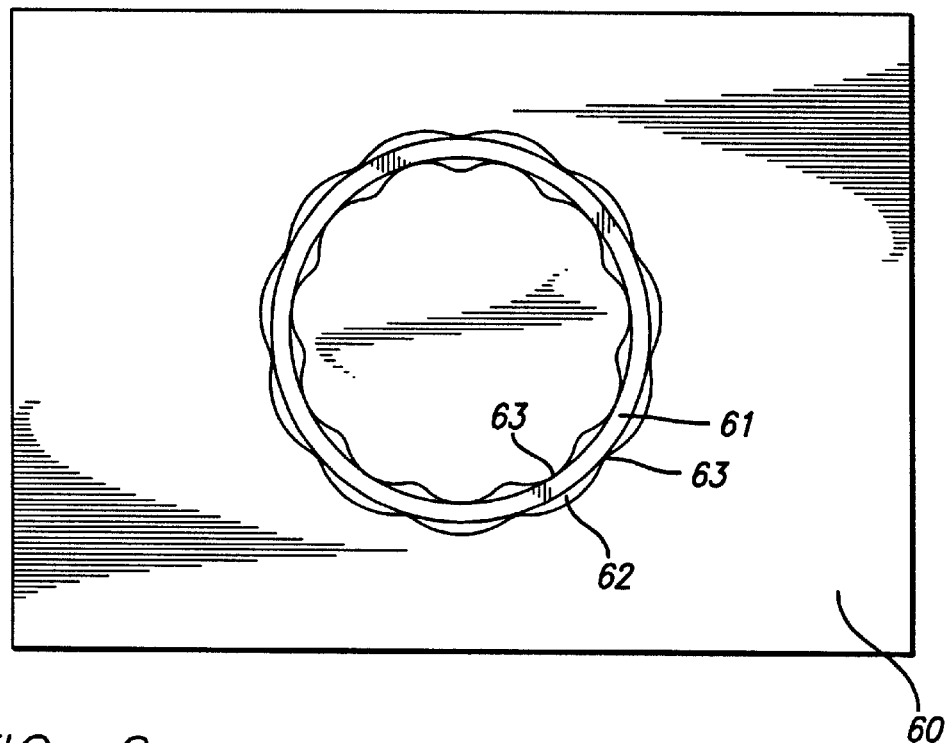
FIG. 6 is a top view illustration of yet another alternative preferred embodiment of the present invention.
Figure 7:
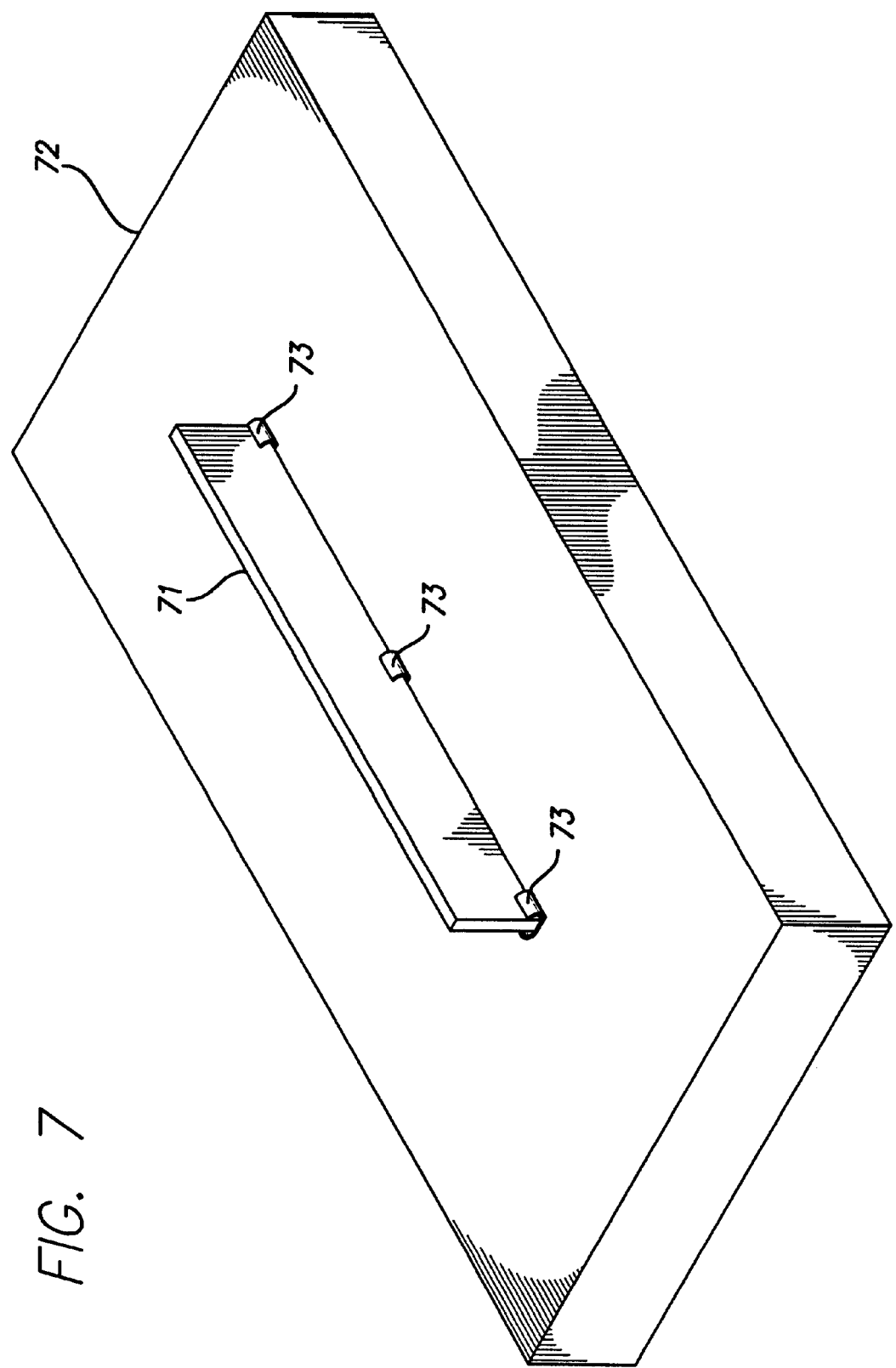
FIG. 7 is an illustration of another conventional method of supporting a mode wall using metal clips.

FIG. 6 shows another alternative preferred embodiment of the present invention. A substantially circular serpentine slot 62 is made using either a diameter cutter or die cast method. Like the substantially straight serpent slot illustrated in FIGS. 3 and 4, the substantially circular serpentine slot includes an area of central clearance such that a ring-like object, such as a substantially circular wall-like structure 61, can be inserted into the area of central clearance and be supported by the serpentine slot via support points 63. This enclosure like scheme is commonly referred to as "dog houses," which is usually formed by conventional methods such as screws or metal clips similar to FIG. 7. It is contemplated as a part of the present invention that any schematic path of the serpentine slot may be formed to support any wall-like structure.

What is claimed:

1. An amplifier assembly, comprising:

a mode wall; and a substrate having an upper support surface for supporting amplifier circuitry which generates EMI emissions having a wavelength, and a substantially serpentine slot in the upper support surface supporting and grounding the mode wall, the serpentine slot defining a plurality of points of contact arranged to contact and ground the mode wall, the points of contact being spaced apart at roughly ¼ of the wavelength or less such that the mode wall is grounded at a spacing of roughly ¼ of the wavelength.

* * * * *